United States Patent [19]

Matsukawa et al.

[11] Patent Number: 4,592,026

[45] Date of Patent: May 27, 1986

[54] MEMORY DEVICE RESISTANT TO SOFT ERRORS

[75] Inventors: Naohiro Matsukawa; Mitsuo Isobe, both of Yokohama; Takayasu Sakurai, Tokyo, all of Japan

[73] Assignee: Shaibaura Denki Kabushiki Kaisha, Japan

[21] Appl. No.: 564,683

[22] Filed: Dec. 23, 1983

[30] Foreign Application Priority Data

Dec. 28, 1982 [JP] Japan .................................. 57-227225

[51] Int. Cl.$^4$ ........................ G11C 7/00; G11C 11/40
[52] U.S. Cl. .................................... 365/203; 365/190; 365/230
[58] Field of Search ............... 365/203, 190, 233, 189, 365/230

[56] References Cited

U.S. PATENT DOCUMENTS

| | | | |
|---|---|---|---|
| 4,069,475 | 1/1978 | Boettcher | 365/203 |
| 4,150,441 | 4/1979 | Ando | 365/203 |
| 4,161,040 | 7/1979 | Satoh | 365/203 |
| 4,355,377 | 10/1982 | Sud et al. | 365/203 |
| 4,417,328 | 11/1983 | Ochii | 365/203 |

FOREIGN PATENT DOCUMENTS 0152931  12/1979  Japan .................................. 365/203

OTHER PUBLICATIONS

Watanabe et al., "A Battery Backup 64K CMOS RAM with Double Level Aluminum Technology," IEEE International Solid-State Circuits Conference, Digest of Technical Papers, pp. 60–61, Feb. 23, 1983.

Primary Examiner—James W. Moffitt
Assistant Examiner—Glenn A. Gossage
Attorney, Agent, or Firm—Finnegan, Henderson, Farabow, Garrett & Dunner

[57] ABSTRACT

In a memory device, a plurality of memory cells are connected to bit line pairs. A precharge circuit is controlled by a chip enable signal during a stand-by state and by an address transition detector signal during an active state, to charge the bit line pairs up to a given power source voltage.

3 Claims, 13 Drawing Figures

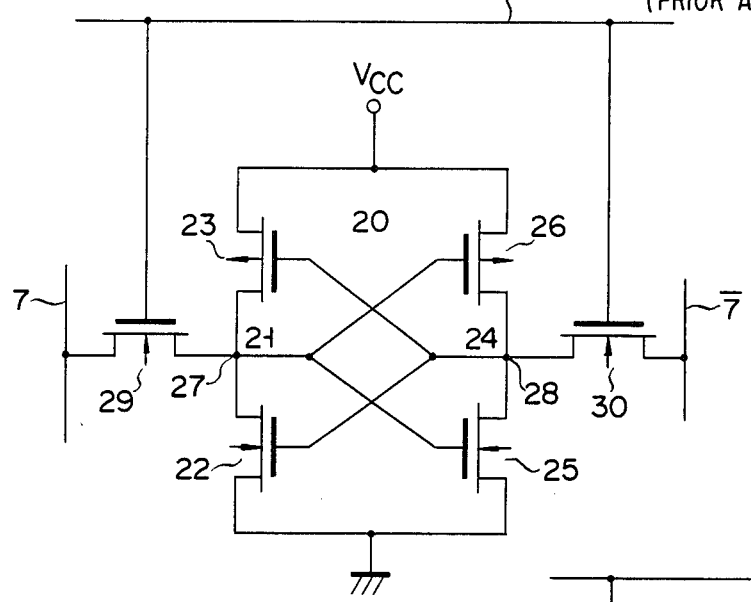
FIG. 2 (PRIOR ART)
FIG. 3 (PRIOR ART)
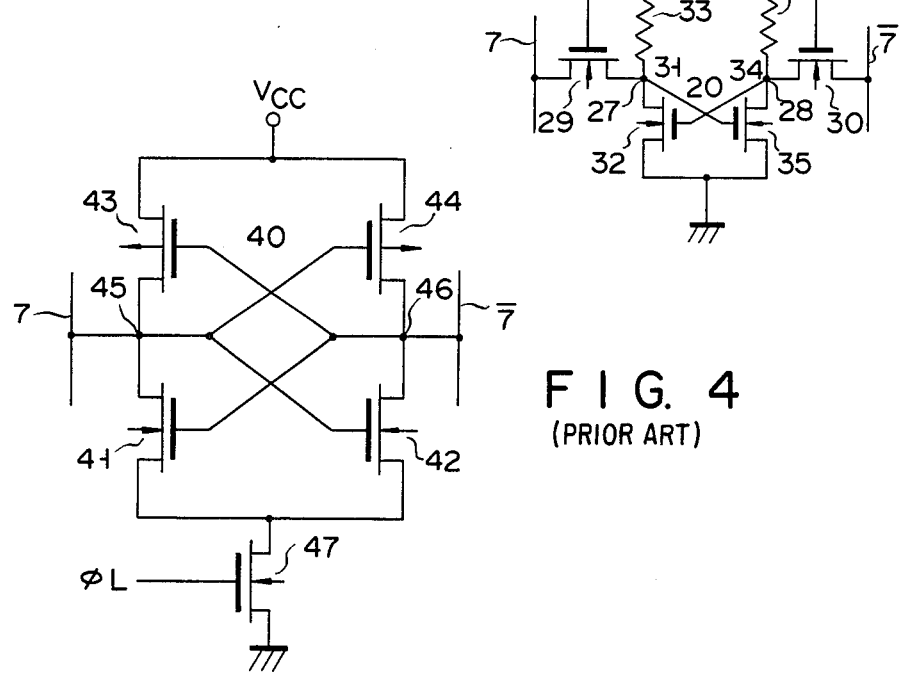
FIG. 4 (PRIOR ART)

F I G. 13
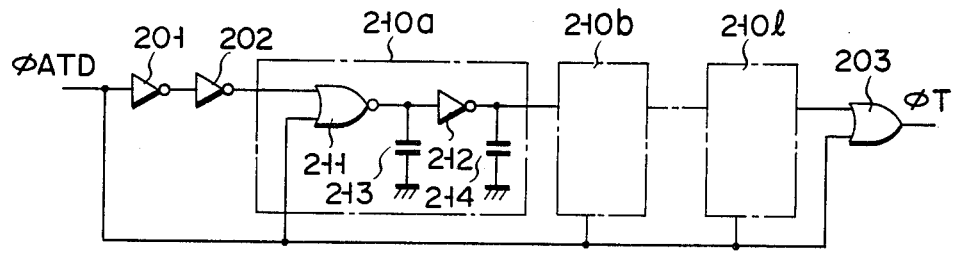

F I G. 10
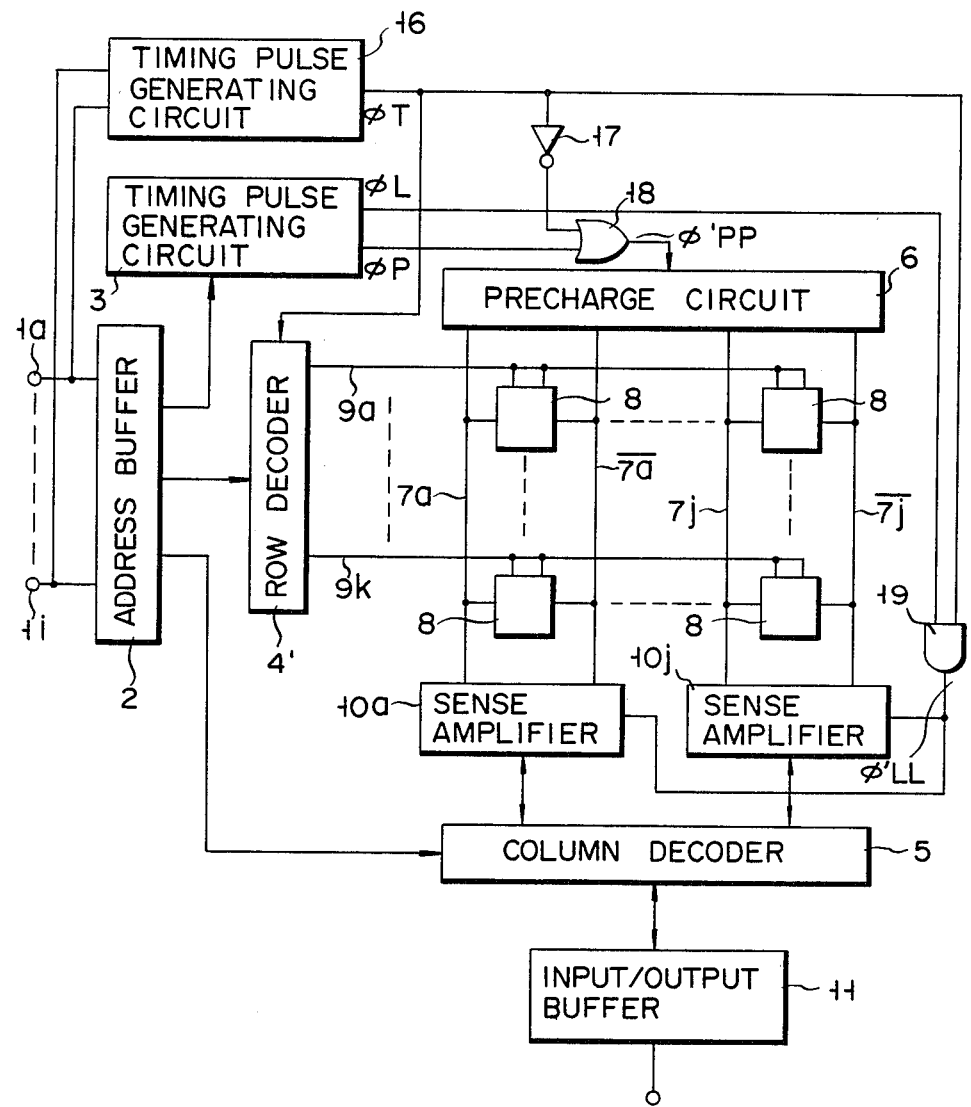

MEMORY DEVICE RESISTANT TO SOFT ERRORS

BACKGROUND OF THE INVENTION

The present invention relates to a memory device having a plurality of memory cells in which, prior to the read out of the data stored in a specific memory cell among the plurality of cells, a bit line coupled to the specific memory cell is charged as to attain a given power source potential.

With the recent increase in the high integration density of the semiconductor memory device, the so-called "soft error" has become problematic in the dynamic random access memory (dynamic RAM). A trace of radioactive substances, e.g., uranium and thorium, irradiates α-rays within the package containing the semiconductor memory chips. By the irradiating α-rays, electron-hole pairs are generated. Electrons of the electron-hole pairs flow into memory nodes for data storage within the memory cells. Therefore, the data held as positive charges in the node are adversely influenced, resulting in an erroneous data read out. This phenomenon is known as the "soft error".

In a static random access memory (static RAM), a flip-flop is used for the memory cell. Since flip-flops are always connected to a power source, they are supplied with a constant current. The static RAM, unlike the dynamic RAM, has been considered free of the soft error problem. Recently, however, in the static RAM, there has also been observed the soft error as in the case of the dynamic RAM. The reason for this is that the increased integration density in the memory device causes the value of the parasitic capacitance at the data storing node to be diminished.

FIG. 1 is a block diagram showing the circuit arrangement of a conventional static RAM. The static RAM is composed of an address buffer 2 with a plurality of address input terminals 1a–1i supplied with an address signal, a timing pulse generating circuit 3, a row decoder 4, a column decoder 5, a precharge circuit 6, a plurality of bit line pairs 7a, $\overline{7a}$–7j, $\overline{7j}$, a plurality of memory cells 8, a plurality of word lines 9a–9k, a plurality of sense amplifiers 10a–10j and an input/output buffer 11. The static RAM is further provided with an input terminal for a chip enable signal and a control circuit for activating the RAM, although these components are not illustrated.

Turning to FIG. 2, a circuit diagram is illustrated as an example of a memory cell used in the static RAM of FIG. 1. This memory cell is made up of a flip-flop 20 including a couple of CMOS inverters 21, 24 which are cross-coupled with each other at the input and output terminals, as shown. The CMOS inverter 21 is composed of an N-channel MOSFET 22 and a P-channel MOSFET 23, and operates by a positive power source voltage Vcc. The CMOS inverter 24 is composed of an N-channel MOSFET 25 and a P-channel MOSFET 26, and operates by the same voltage Vcc. The memory cell is provided with a couple of transfer gates 29 and 30 as N-channel MOSFETs. The source electrodes of the transfer gates 29 and 30 are respectively coupled with a pair of data storing nodes 27 and 28 in the flip-flop 20. The drain electrodes of the transfer gates 29 and 30 are respectively connected to the bit lines 7 and $\overline{7}$, and the gate electrodes thereof are connected to a single word line 9. The data write and data read operations, both to and from the memory cells, are controlled by a signal on the word line 9.

FIG. 3 is a circuit diagram of one of the memory cells used in the static RAM of FIG. 1, which features a geometrical reduction of the cell area. In the memory cell, a flip-flop 20 is composed of an inverter 31, including a drive N-channel MOSFET 32 and a load resistor 33, and another inverter 34 including a drive N-channel MOSFET 35 and a load resistor 36. These inverters 31, 34 are cross-coupled with each other at the input and output terminals, as shown.

It is to be noted here that, in the FIG. 3 memory cell, P-channel MOSFETs 23 and 26 (FIG. 2) are replaced by load resistors 33 and 36, respectively. In integrated circuits having a number of circuit elements integrated therein, the element area of a resistor is much smaller than that of a MOSFET. Therefore, a memory device constructed using the FIG. 3 memory cell has a higher integration density than the memory device constructed using the FIG. 2 memory cell. Further, the resistance of the load resistors 33 and 36 are set at values larger than those of the MOSFETs 23 and 26 in an ON state, in order to reduce the power consumption in an overall circuit. For example, the resistance of the load resistors 33 and 36 are several giga ohms when the on-resistance of the MOSFETs 23 and 26 are set at several kilo ohms. For this reason, the number of charges supplied from the power source to the parasitic capacitance of the pair of data storing nodes 27, 28 in the FIG. 3 memory cell is decreased.

FIG. 4 is a circuit diagram of an example of a data latch type sense amplifier 10 used in the static RAM of FIG. 1. This sense amplifier has a flip-flop 40 including N-channel MOSFETs 41 and 42 and P-channel MOSFETs 43 and 44. Data storing nodes 45 and 46 are respectively connected to bit lines 7 and $\overline{7}$. A current path of an N-channel MOSFET 47 is provided between the flip-flop 40 and ground. The gate electrode of the MOSFET 47 is applied with a data sense control pulse signal $\phi_L$ generated by the timing pulse generating circuit 3.

The operation of the static RAM of FIG. 1 may now be described, with reference to the timing charts of FIG. 5. In the explanation to follow, a positive logic in which a high level is Vcc and a low level is a ground level, will be employed for the circuit. The static RAM is of the asynchronous type. A typical read out operation may be described as follows, for the sake of simplicity.

1. A chip enable signal CE has its logical state changed from low to high. Then, the static RAM is activated. The operation mode of the static RAM changes from a stand-by mode to an active mode.
2. A new address AD is input to the static RAM.
3. The logical state of the pulse signal $\phi_L$ is changd from high to low. The data sensing operations of the sense amplifiers 10a–10j are stopped.
4. The pulse signal $\phi_P$ is changed in its logical state from low to high. The static RAM is in a precharge mode. Then, the precharge circuit 6 starts the precharge operation of bit lines 7 and $\overline{7}$. In the precharge operation of bit lines 7 and $\overline{7}$, the bit line at a low level is precharged, so that both bit lines 7 and $\overline{7}$ are at a high level.
5. The pulse signal $\phi_P$ has its logical level changed from high to low. Then, the precharging operation of the precharge circuit 6 stops.
6. The signal WL on a single word line has its logical level changed from low to high, in response to the address AD. Then, the high level pulse signal $\phi_L$ enables the pair of transfer gates 29, 30 in the plurality of memory cells 8 connected to the specific word line. For example, a signal WL on one word line 9A is at a high level. One of the data storing nodes 27 in the memory cell 8 coupled to a pair of bit lines (7a and $\overline{7a}$) is at a high level, while the other data storing node is at a low level. In such a case, the potential BL on one bit line 7a is kept at a high level, while the potential of the signal $\overline{BL}$ on the other bit line $\overline{7a}$ begins to drop toward a low level.

7. The logical state of the pulse signal $\phi_L$ is changed from a low level to a high level. The sense amplifiers 10a–10j begin to operate. The amplifiers 10a–10j, when operated, accelerate the potential dropping rate of the signal ($\overline{BL}$ in FIG. 5) on the bit line at a low level (of bit lines 7 and $\overline{7}$), and the signal quickly drops its potential to a low level.
Following this, the data in the memory cell, as given by the address AD, is output through the column decoder 5 and the I/O buffer 11. At this point, the data read out operation is completed.

8. Subsequently, a data write operation is executed, if necessary. Finally, the logical state of the chip enable signal CE is set, going from a high level to a low level. The signal WL on the word line 9 is set at a low level, and the static RAM is in a stand-by mode.

In the static RAM of FIG. 1, transfer gates 29 and 30, which are in the memory cell, are respectively at the same potentials on bit lines 7 and $\overline{7}$, which bit lines 7, $\overline{7}$ are connected to the drains. With this connection, a wide depletion layer is formed around the drain of the transfer gate connected to the bit line, which has been set at a high level. Due to the presence of this depletion layer, the drain of the transfer gate (not the data storing node) absorbs the electrons generated by the emitted α-rays. The depletion layer formed around the drain of the bit line having been set at a low level is narrow.

FIG. 6 shows a cross section of the structure of the transfer gate 30 in the memory cell of FIG. 3. In FIG. 6, 50 designates a P type silicon substrate, 51 an N+ type source, 52 an N+ type drain, 53 a gate oxide film, and 54 a gate electrode. If the drain 52 of the transfer gate is set in a low level, the width of the depletion layer 55 formed around the drain 52 is narrow. When the source 51 of the transfer gate 30 connected to the data storing node 28 is set in a low level, no problem arises. However, when the source 51 is set in a high level (Vcc potential) through the load resistor 36, a problem arises. Specifically, when the source 51 is set at a high level, a wide depletion layer 56 is formed around the source 51. When electrons are generated in the vicinity of the source 51 by the α-rays applied, the electrons are accelerated in the depletion layer 56 and reach the source 51. Therefore, most of the electrons are absorbed by the source 51. The absorbed electrons neutralize the positive electrons previously stored in the parasitic capacitor C, being parasitic on the data storing node 28 connected to the source 51. This results in the soft error in question. Particularly, in the static RAM employing flip-flops using the load resistors shown in FIG. 3 for the memory cell, the resistance of the load resistors connected between the pair of data storing nodes 27, 28 and the power source is very high. For this reason, when the electrons are absorbed into both nodes 27 and 28, the transfer of the positive charges from the power source is impeded and, as a result, the soft error tends to occur. As described above, in the conventional static RAM, the soft error tends to occur in the stand-by period.

While the asynchronous static RAM has been described above, the problems associated therewith also apply to the synchronous type static RAM as well.

SUMMARY OF THE INVENTION

Accordingly, a primary object of the present invention is to provide a memory device which is little affected by the soft error.

According to the present invention, a memory device is provided, which memory device has a stand-by period and an active period including a precharge period, and comprises: bit lines for transferring data, a plurality of memory cells connected to the bit lines, a precharge circuit for charging the bit lines up to a predetermined potential, and charge control means for operating the precharge circuit during the stand-by period and the precharge period to charge the bit lines up to a predetermined potential.

BRIEF DESCRIPTION OF THE DRAWINGS

FIG. 2 is a circuit diagram of an example of a memory cell used in the RAM of FIG. 1;

FIG. 3 is a circuit diagram of another example of a memory cell used in the RAM of FIG. 1;

FIG. 4 is a circuit diagram of example of a sense amplifier used in the RAM of FIG. 1;

FIG. 10 shows a block diagram of another embodiment according to the present invention;

FIG. 13 is a circuit diagram illustrating the details of a part of the circuit diagram of FIG. 12.

DETAILED DESCRIPTION OF THE PREFERRED EMBODIMENTS

Some specific embodiments of the present invention may be described as follows, with reference to the accompanying drawings.

Figure 1:
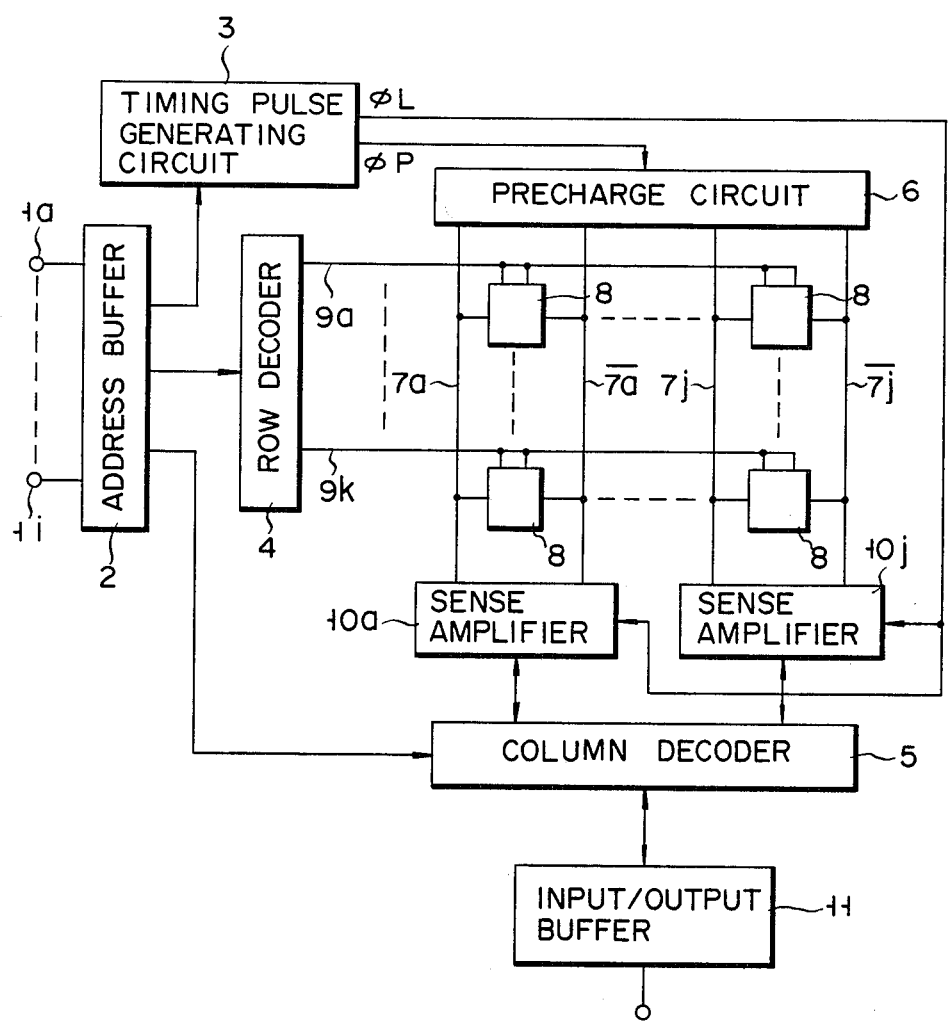
FIG. 1 shows a block diagram of a conventional static RAM.
Figure 5:
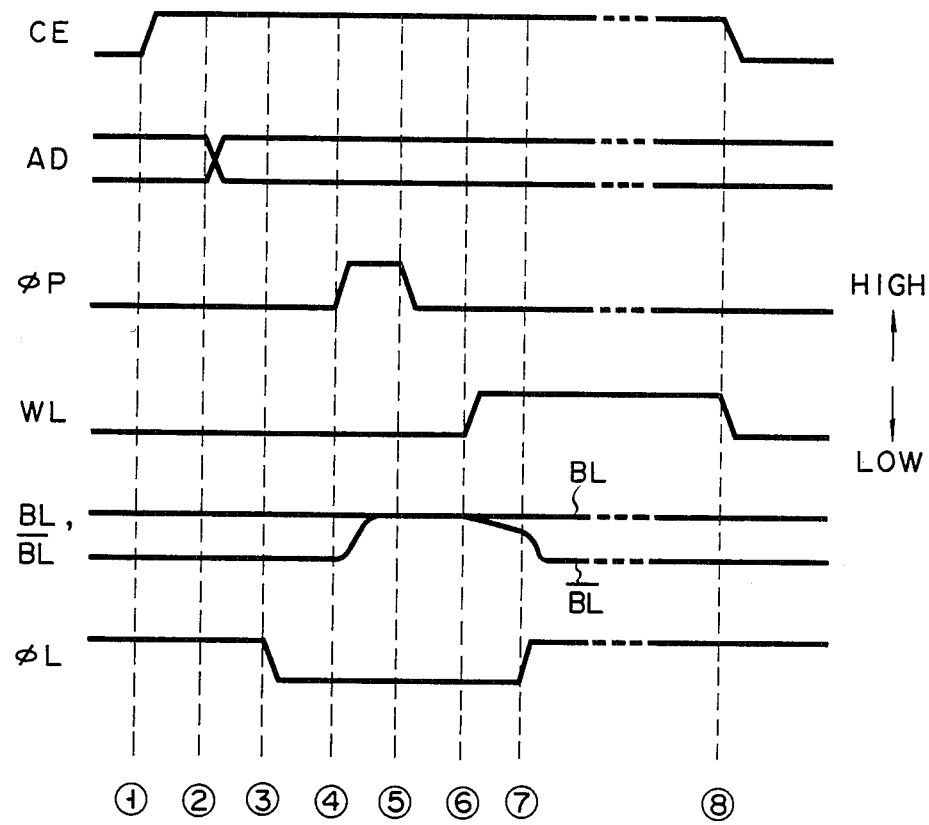
FIG. 5 shows timing diagrams useful in explaining the operation of the RAM of FIG. 1.
Figure 6:
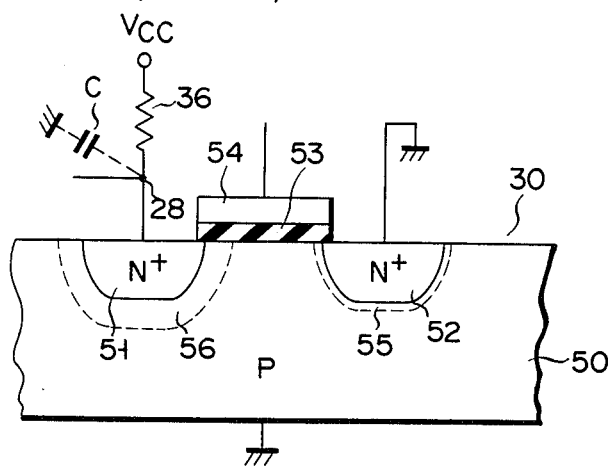
FIG. 6 structurally and schematically illustrates one of the transfer gates used in the memory cell of FIG. 3.
Figure 7:
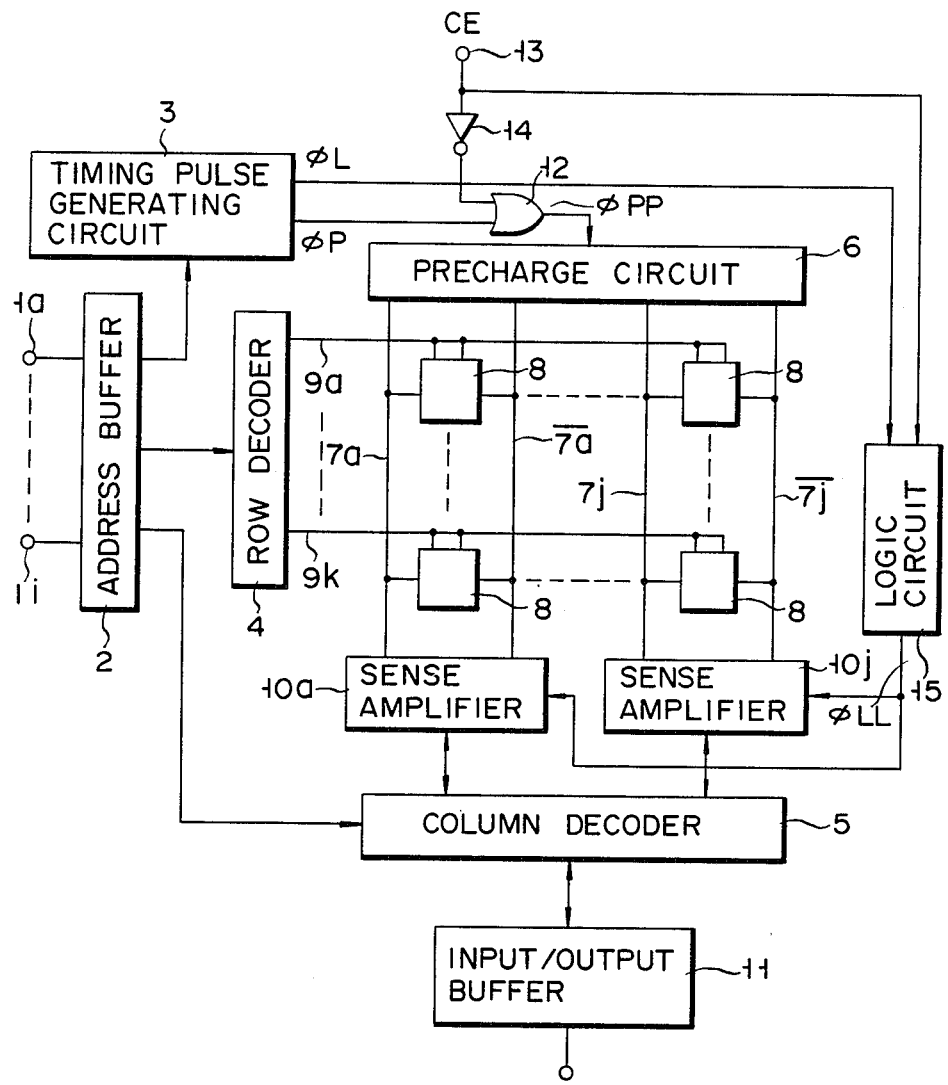
FIG. 7 is a block diagram of an embodiment of a memory device according to the present invention.

FIG. 7 shows, in block form, the circuit arrangement of an embodiment of the memory device according to the present invention. That embodiment of the present invention includes a static RAM, as in the case of FIG. 1. In FIG. 7, like reference symbols are applied for like or equivalent portions in FIG. 1. In FIG. 7, a plurality of address input terminals 1a–1i receive an address signal. The address signal is then applied to an address buffer 2. The output signal of the address buffer 2 is applied to a timing pulse generating circuit 3, a row decoder 4 and a column decoder 5. The timing pulse generating circuit 3 is used in generating pulse signals to control the operation of a precharge circuit 6 (to be described in detail later) and sense amplifiers 10a–10j.

One of the pulse signals generated is a precharge control pulse signal $\phi_p$ which is set at a high level for a predetermined period after the address signal changes; and another pulse signal is a data sense control pulse signal $\phi_L$ which is set at a low level for a predetermined period after the address signal changes. The signal $\phi_p$ of the timing pulse generating circuit 3 is supplied to an OR gate 12. The chip enable signal CE input to an input terminal 13 is applied to the OR gate 12, through an inverter 14.

The output signal $\phi_{pp}$ derived from the OR gate 12 is supplied to the precharge circuit 6. The precharge circuit 6 is the well-known circuit composed of a plurality of MOSFETs of which the current paths are connected at ends to a positive power source Vcc, and the gates are supplied with the signal $\phi_{pp}$. The precharge operation of the precharge circuit 6 is controlled by the signal $\phi_{pp}$ output from the OR gate 12. The precharge circuit 6 is coupled with a plurality of bit line pairs 7a, $\overline{7a}$–7j, $\overline{7j}$. A plurality of memory cells 8 are connected in parallel between a pair of bit lines 7 and $\overline{7}$. The plurality of memory cells 8 arrayed in a matrix fashion have each the same construction as that of the memory cell shown in FIG. 2 or 3.

Each of the word lines 9a–9k is connected to a plurality of memory cells arranged in a row direction. The plurality of word lines 9a–9k are connected to a row decoder 4. The word lines 9a–9k are driven by the output signal from the row decoder 4, so that a specific word line is set at a high level.

A plurality of sense amplifiers 10a–10j of the latch type, as shown in FIG. 4, are coupled to bit line pairs 7 and $\overline{7}$, respectively. The data sense control pulse signal $\phi_L$ output from the timing pulse generating circuit 3, and the output signal $\phi_{LL}$ from a logic circuit 15, with the chip enable signal CE applied to the input terminal 13, are connected to the plurality of sense amplifiers 10a–10j. The data sensing operation performed by the sense amplifiers 10a–10j is controlled by the signal $\phi_{LL}$ derived from the logic circuit 15. The plurality of sense amplifiers 10a–10j are coupled with the column decoder 5.

According to the output signal from the address buffer 2, the column decoder 5 selects a specific one of the sense amplifiers 10a–10j. An input/output (I/O) buffer 11 is connected to the column decoder 5. Data is input and output through the I/O buffer 11 to and from the column decoder 5. The static RAM is provided with a control circuit (not shown) for activating the RAM when the chip enable signal CE is applied to the input terminal 13.

Figure 8:
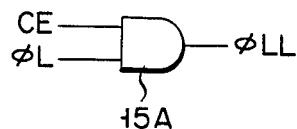
FIG. 8 illustrates a schematic diagram of a part of the memory device of FIG. 7.

Details of the logic circuit 15 of FIG. 7 are shown in FIG. 8. As shown, the logic circuit 15 consists of an AND gate 15A connected to the data sense control pulse signal $\phi_L$ and the chip enable signal CE. Signal $\phi_{LL}$ is obtained as the output signal from the AND gate 15A.

Figure 9:
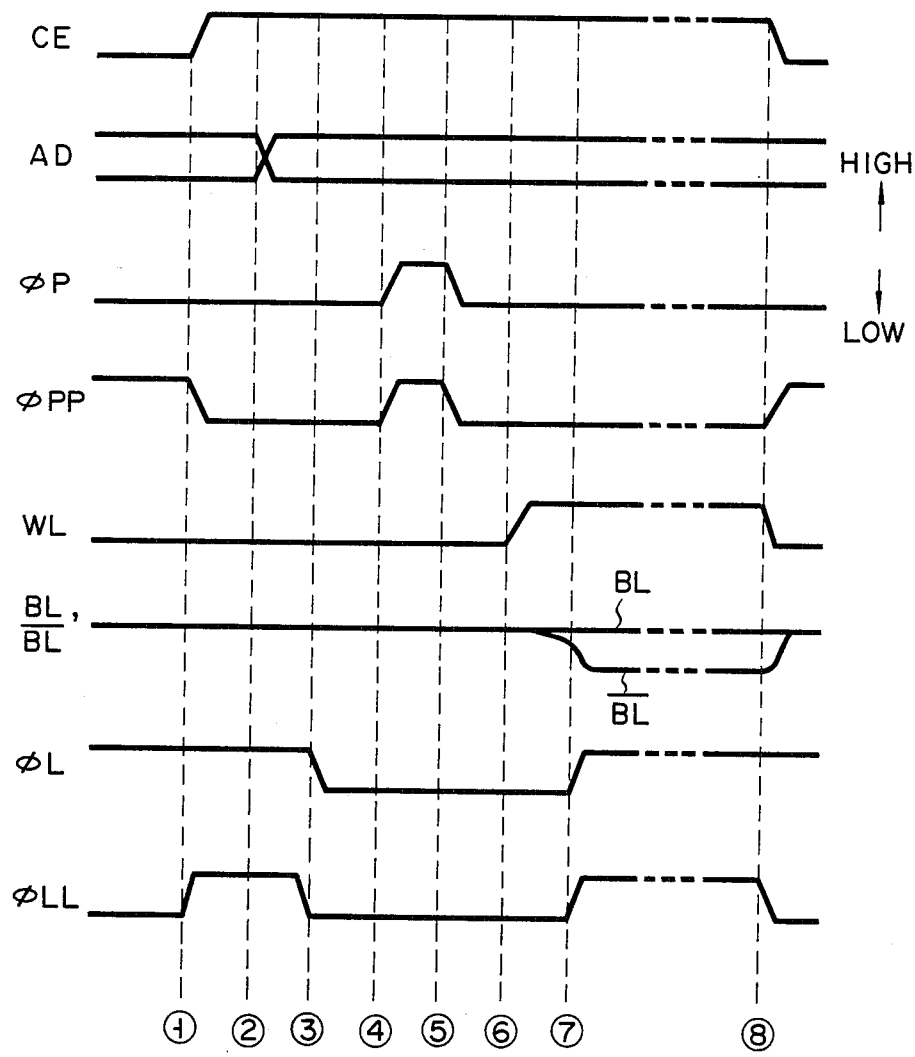
FIG. 9 shows timing diagrams which are useful in explaining the operation of the memory device of FIG. 8.

The operation of the static RAM constructed as shown in FIG. 7 may now be described, with reference to the timing charts shown in FIG. 9.

1. The chip enable signal CE is changed in its logical state from low to high. Then, the static RAM is activated and shifts from the stand-by period to the active period. With the high level of the chip enable signal CE, the output signal of the inverter 14 is at a low level. In turn, the signal $\phi_{pp}$ output from the OR gate 12 is at a low level, and the precharge circuit 6 stops its precharge operation.

2. A new address is input into the memory device.

3. Upon the detection of a change in the address AD, the timing pulse generating circuit 3 changes the logical state of the data sense control pulse signal $\phi_L$ from high to low. At this time, the signal $\phi_{LL}$ is set at a low level. The sense amplifiers 10a–10j stop their data sensing operation.

4. Upon the detection of a change in the address AD, the timing pulse generating circuit 3 changes the logical state of the pulse signal $\phi_p$ from low to high. Then, the OR gate 12 sets the logical state of its output signal $\phi_{pp}$ to a high level. Under such conditions, the static RAM enters the precharge period, to thereby cause the precharge circuit 6 to start precharging the bit lines 7, $\overline{7}$.

5. The pulse width period of the pulse signal $\phi_p$ terminates, and the pulse $\phi_p$ is at a low level. The signal $\phi_{pp}$ of the OR gate 12 is also at a low level. Under such conditions, the precharge period terminates and the precharge circuit 6 stops the precharge operation.

6. In response to the address AD, the signal WL on a specific word line has its logical level changed from low to high. The plurality of memory cells connected to the specific word line 9 are selected and the transfer gates (29 and 30, FIG. 2 or 3) are enabled. According to the data stored in each memory cell, the potential of the signal BL on bit line 7, for example, which is one of bit lines 7 and $\overline{7}$, is kept at a high level; while the potential of the signal $\overline{BL}$ on the other bit line $\overline{7}$ begins to drop toward a low level.

7. The pulse width period of the data sense control pulse signal $\phi_L$ terminates and is at a high level. At this time, the chip enable signal CE is at a high level. Accordingly, after the data sense control pulse signal $\phi_L$ attains a high level, the signal $\phi_{LL}$ from the logic circuit 15 is set at a high level and the sense amplifiers 10a–10j start their operation. The sense amplifiers 10a–10j accelerate the potential dropping rate of the signal on the low level bit line of each bit line pair. As a result, the signal on either bit line pair (7 or $\overline{7}$; or, $\overline{BL}$, in FIG. 9) is rapidly set at a low level. Subsequently, the data stored in the memory cell, as specified by the address AD, is output through the column decoder 5 and the I/O buffer 11. In this way, the read out operation is performed.

8. A sequence of operations including subsequent read out and write operations is executed. Upon the completion of the operations, the chip enable signal CE is changed from a high level to a low level, and the static RAM shifts from the active period to the stand-by period. In accordance with the low level of the signal CE, the signals WL on the word lines 9 are all at a low level, so that the row decoder 4 stops the memory cell select operation. When the signal CE is set at a low level, the output signal $\phi_{pp}$ from the OR gate 12 is at a high level and the precharge circuit 6 starts the precharge operation of each bit line 7, $\overline{7}$. As a result, all of the bit lines 7, $\overline{7}$ are raised to a high level. A low level state of the signal CE sets the signal $\phi_{LL}$ of the logic circuit 15 at a low level, and the sense amplifiers 10a–10j stop their operation. Subsequently, the logical level of the signals on all of the bit lines 7, $\overline{7}$ are kept high by the precharge circuit 6, until the next chip enable signal CE attains a high level.

As may be seen from the foregoing description, in the static RAM of the present embodiment, the precharge circuit 6 is so operated as to set all of the bit lines at a high level, not only during the precharge period of the static RAM, where the pulse $\phi_p$ is high in level, but also during the stand-by period, where the chip enable signal CE is low in level. Thus, during the stand-by period, all of the bit line pairs 7a, $\overline{7a}$-7j, $\overline{7j}$ are kept at a high level. Therefore, large depletion layers are formed around the drains of a couple of transfer gates (29 and 30, in FIG. 2 or 3) in the memory cell 8. Therefore, electrons generated by the α-rays in the static RAM are more easily absorbed by the drains of the transfer gates in the memory cell 8 than the data storing nodes (27 and 28, in FIG. 2 or 3). Accordingly, during the stand-by period, the electrons generated by the α-rays are absorbed by the data storing node in the memory cell 8 with a remarkably reduced probability. Consequently, the static RAM according to the present invention is little affected by the soft error.

In FIG. 10; there is shown in block form a circuit arrangement of another embodiment of a static RAM according to the present invention. Also in this embodiment, the present invention is applied to a static RAM, as in the embodiment of FIG. 7. The embodiment in FIG. 10 is featured by another timing pulse generating circuit 16. As shown, the timing pulse generating circuit 16 is supplied with an address input to the address input terminals 1a-1i. The timing pulse generating circuit 16 produces a pulse signal $\phi_T$ changing its logical state from a high level to a low level when the time taken for one cycle of the data read out or write elapses. The pulse signal $\phi_T$ output from the timing pulse generating circuit 16 is supplied to an OR gate 18, through an inverter 17, as well as to a row decoder 4' and an AND gate 19. The OR gate 18 is also supplied with the precharge control pulse signal $\phi_p$ output from the timing pulse generating circuit 3. The output signal $\phi'_{pp}$ from the OR gate 18 is supplied to the precharge circuit 6. This signal controls the precharge operation of the precharge circuit 6.

The AND gate 19 is further supplied with the data sense control pulse signal $\phi_L$ output from the timing pulse generating circuit 3. The output signal $\phi'_{LL}$ from the AND gate 19 is supplied to the plurality of sense amplifiers 10a-10j. The sensing operation performed by the word lines 9a-9k of the row decoder 4' is controlled by the pulse signal $\phi_T$ output from the timing pulse generating circuit 16.

Figure 11:
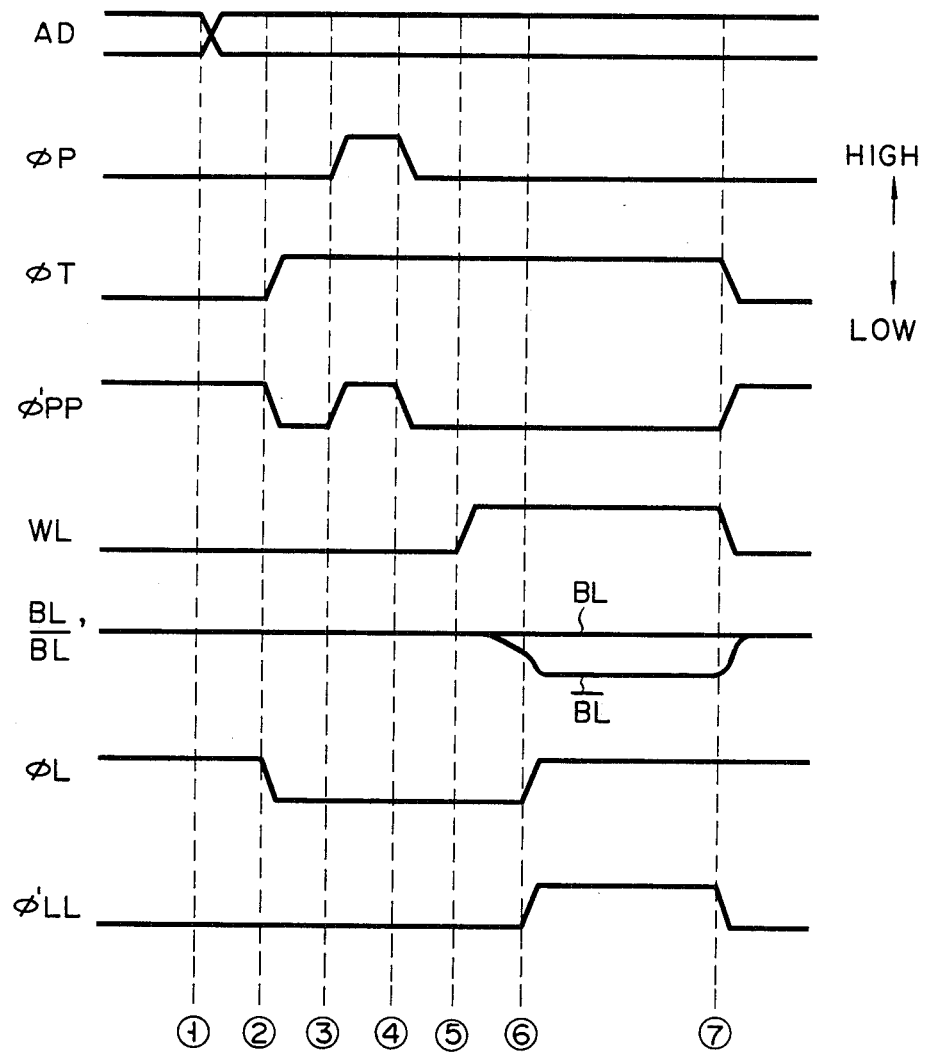
FIG. 11 shows timing charts which are useful in explaining the operation of the memory device of FIG. 10.

The embodiment of FIG. 10 operates according to the sequence shown in FIG. 11. As seen from the timing charts, the pulse signal $\phi_T$ output from the timing pulse generating circuit 16 plays the same role as the chip enable signal CE in the previous embodiment. With this pulse, all of the bit line pairs 7a, $\overline{7a}$-7j, $\overline{7j}$ can be set at a high level during the intervals between the read out or write operations, even when the chip enable signal CE is at a high level.

Figure 12:
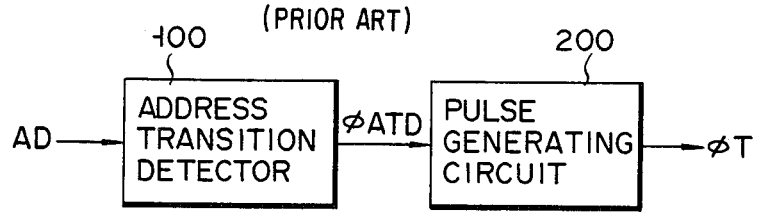
FIG. 12 is a block diagram illustrating the details of a part of the memory device of FIG. 10.

FIG. 12 shows a block diagram of the timing pulse generating circuit 16 used in the FIG. 10 embodiment. This circuit is composed of a known address transition detector 100, and a pulse generating circuit 200 which is used in generating a pulse signal $\phi_T$ with a fixed pulse width, on the basis of the pulse signal $\phi_{ATD}$. The pulse generating circuit 200 has the circuit arrangement shown in FIG. 13. As shown, the pulse signal $\phi_{ATD}$ of the address transition detector 100 is supplied to the first stage of a series of signal delay circuits 210a-210l connected in a cascade fashion. The pulse signal $\phi_{ATD}$ is supplied to an OR gate 203 supplied with a delay signal derived from the final stage of the signal delay circuit 210l.

Each stage of the signal delay circuits 210a-210l is composed of a NOR gate 211 supplied with the output signal of the inverter 202, or the output signal from the preceding stage of the signal delay circuit, and the pulse signal $\phi_{ATD}$; an inverter 212 for inverting the output signal of the NOR gate 211; and capacitors 213, 214 which are connected between the input of the inverter 212 and ground and between the output of the inverter 212 and ground, respectively.

In this pulse generating circuit 200, the pulse width of the pulse signal $\phi_T$ can be adjusted by changing the number of signal delay circuits 210.

According to this embodiment, all of the bit line pairs 7a, $\overline{7a}$-7j, $\overline{7j}$ can be set at a high level when the read out and write operations are not performed. Therefore, the soft error rate can be much reduced.

In this embodiment, the potential control of the bit line pairs 7a, $\overline{7a}$-7j, $\overline{7j}$ is performed by using only the address AD. Moreover, in this embodiment, the high to low level change of the pulse signal $\phi_T$ is timed under the control of the timing pulse generating circuit 16. Alternatively, this level change can be timed by using the signal produced when the end of the read out or write operation is sensed. For such sensing, there is a way to sense a change in the potential on the bit line pairs 7a, $\overline{7a}$-7j, $\overline{7j}$, or to sense the operation of the input-/output buffer 11.

While the sense amplifiers 10 are provided in common for each of the bit line pairs. In the above-mentioned embodiments, the static RAM is one with a positive power potential to which the present invention has been applied. It is evident, however, that the present invention may also be applied to a static RAM with a negative power potential. Furthermore, the present invention is applicable to synchronous and asynchronous static RAMs, as well as to other dynamic RAMs.

We claim:

1. A memory device for reducing soft errors comprising:
   a pair of bit lines for transferring data;
   a plurality of memory cells connected to said bit lines;
   a charging circuit coupled to said bit lines for charging said bit lines to a predetermined potential;
   an address input terminal for receiving an address for said memory cells;
   a first pulse generating circuit coupled to said address input terminal for generating a first pulse signal after said address changes, said first pulse signal including a plurality of first pulses each having a first predetermined pulse duration;
   a second pulse generating circuit coupled to said address input terminal for generating a second pulse signal after said address changes, said second pulse signal including a plurality of second pulses having a second predetermined pulse duration longer than said predetermined pulse duration of said first pulse signal, said first pulses occurring during the pulse durations of said second pulses; and
   a logic circuit connected to said first and second pulse generating circuits for driving said charging circuit during the duration of said first pulses and between said second pulses.

2. A memory device according to claim 1, further comprising a sense amplifier for sensing data via the potential on said bit lines, and data sense control means for controlling the data sensing operation of said sense amplifier.

3. A memory device according to claim 1, in which said memory cells each comprise a flip-flop which includes two inverters cross-coupled at the inputs and outputs, with each of said inverters including a load resistor and a drive transistor.

* * * * *

UNITED STATES PATENT AND TRADEMARK OFFICE
CERTIFICATE OF CORRECTION

PATENT NO. : 4,592,026
DATED : May 27, 1986
INVENTOR(S) : Naohiro MATSUKAWA et al.

It is certified that error appears in the above-identified patent and that said Letters Patent is hereby corrected as shown below:

On the title page Assignee should read:

-- (73) Assignee: Tokyo Shibaura Denki Kabushiki Kaisha, Kawasaki, Japan --.

Signed and Sealed this

Thirteenth Day of July, 1993

Attest:

MICHAEL K. KIRK

*Attesting Officer*     *Acting Commissioner of Patents and Trademarks*